United States Patent [19]
Hollyday et al.

[11] 3,939,444
[45] Feb. 17, 1976

[54] PRINTED CIRCUIT MOUNTABLE, SELF GROUNDING, MULTIPLE FILTER MODULE

[75] Inventors: Robert David Hollyday, Hershey; Jack Leo Bradbery, Harrisburg; William Jeffrey Hudson, Jr., Hershey, all of Pa.

[73] Assignee: AMP Incorporated, Harrisburg, Pa.

[22] Filed: Jan. 11, 1974

[21] Appl. No.: 432,739

[52] U.S. Cl. ............... 333/79; 174/51; 317/101 C
[51] Int. Cl.². H03H 13/00; H05K 1/12; H05K 9/00
[58] Field of Search ............ 333/70 S, 12, 79; 174/52 R, 51; 317/101 C

[56] References Cited
UNITED STATES PATENTS

| | | |
|---|---|---|
| 2,940,058 | 6/1960 | Foster .................................. 333/70 S |
| 3,129,396 | 4/1964 | Germain et al. ....................... 333/79 |
| 3,324,226 | 6/1967 | Tems et al. .......................... 174/52 R |
| 3,621,112 | 11/1971 | Stickley et al. ........................ 174/51 |
| 3,648,222 | 3/1972 | Cowmeadow ........................... 333/79 |
| 3,725,825 | 4/1973 | Hudson, Jr. ............................ 333/79 |
| 3,821,610 | 6/1974 | Harcombe ......................... 317/101 C |
| 3,842,374 | 10/1974 | Schlicke ................................ 333/79 |

Primary Examiner—Alfred E. Smith
Assistant Examiner—Wm. H. Punter
Attorney, Agent, or Firm—Gerald K. Kita

[57] ABSTRACT

The disclosure relates to a filter module which is self groundable when mounted on a printed circuit board. The filter modules include a pair of ground planes mounted normal to each other and each secured to the ground sleeves of the filters and also to a ground plane on the printed circuit board.

4 Claims, 4 Drawing Figures

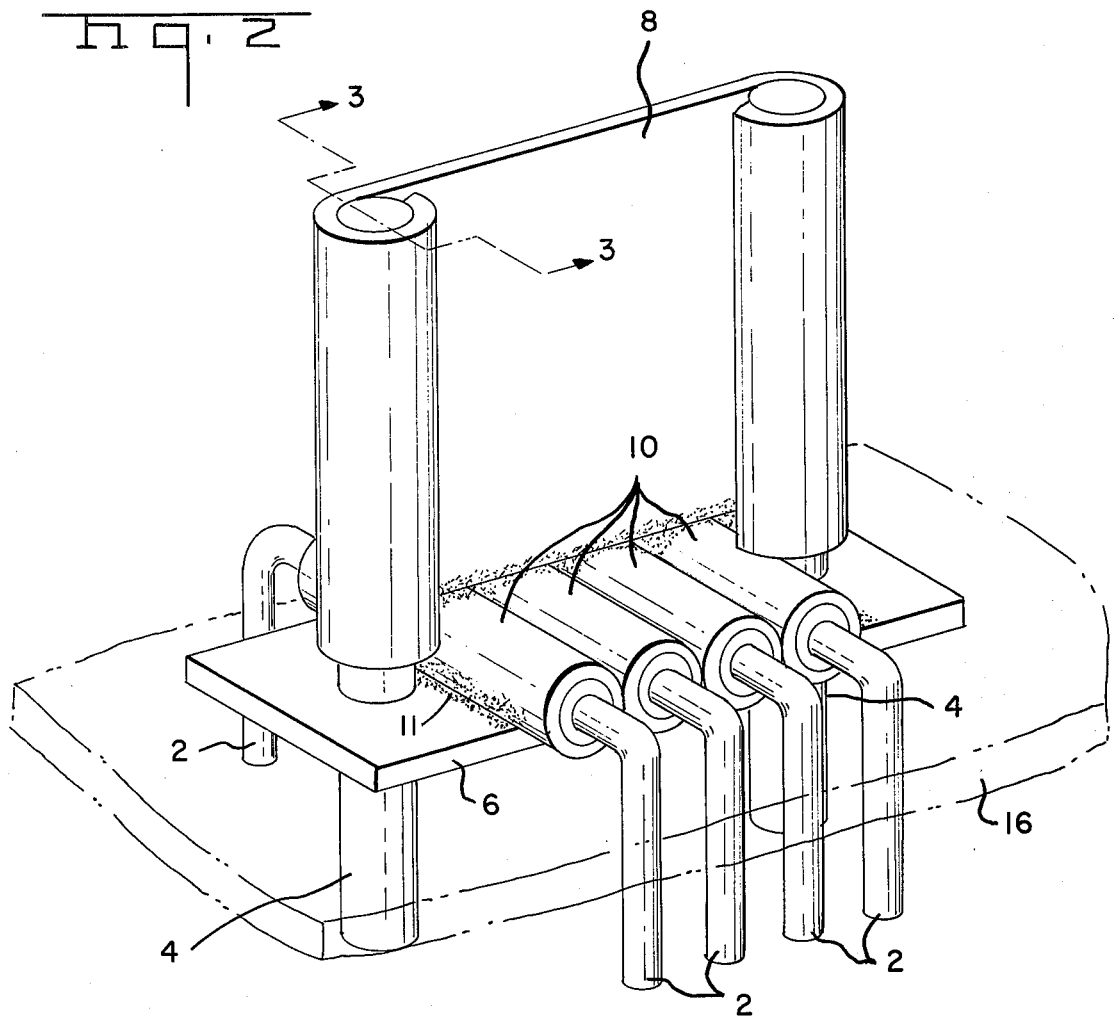
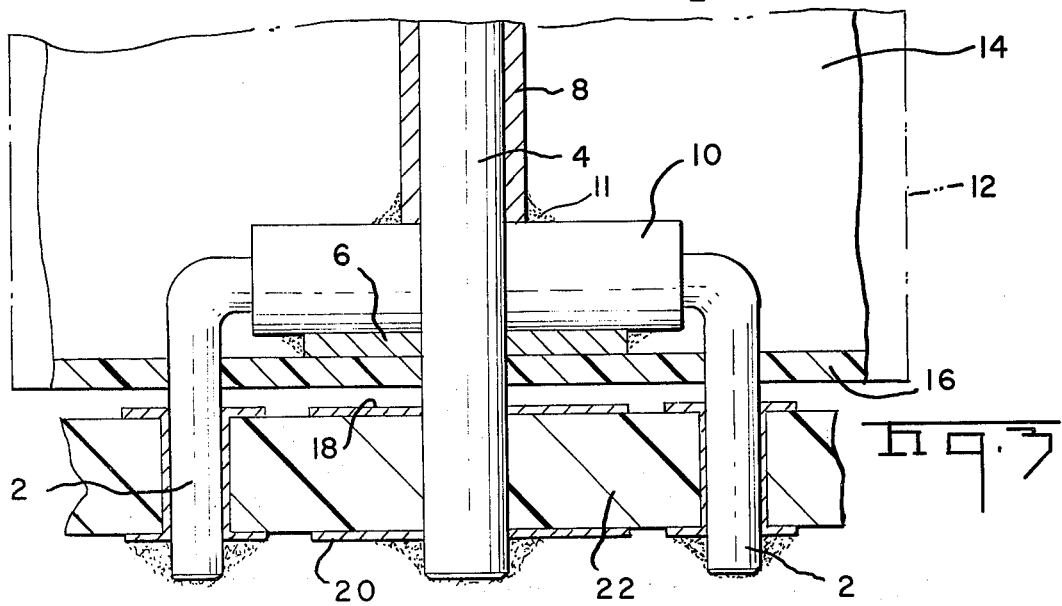

PRINTED CIRCUIT MOUNTABLE, SELF GROUNDING, MULTIPLE FILTER MODULE

This invention relates to a filter module and, more specifically, to a filter module having ground planes connected thereto which will improve filter performance when connected on a printed circuit board to better approximate ideal operation thereof, as if connected in a coaxial environment.

Standard subminiature lossy ceramic filters have found great utility in the art. Normally, filters of this type have been connected in a substantially infinite ground plane environment so that leakage from input to output terminals was minimal. However, when it is necessary to mount such filters on printed circuit boards, there is no available infinite ground plane as found when used with coaxial cables annd typically bulkhead mounted techniques or the like. For this reason, such filters, when mounted on printed circuit boards, have been subject to high leakage and often rendered substantially useless filtering characteristics. It has also been difficult, if at all possible, to readily provide an infinite ground plane on a printed circuit board.

In accordance with the present invention, there is provided a ceramic filter assembly which is mountable on a printed circuit board and also closely approximates the filtering performance of such filters having a substantially infinite ground plane, this being provided as an integral part of the filter assembly in a relatively inexpensive and simple manner.

Briefly, the above is accomplished by mounting the filters on a header and mounting a ground plane on a surface of the header in contact with the filter sleeves. A second ground plane normal to the first ground plane is connected to the first ground plane and/or the filter sleeves, both ground planes being connected to a third ground plane on the surface of a printed circuit board via pins or the like when the filter assembly is mounted in the printed circuit board. One or more adjacent filters can be mounted in a package. Each of the ground planes extends beyond all of the filters of the assembly at both ends. The entire assembly can be encapsulated and, if desired, one of the ground planes can extend to the surface of the encapsulating material for connection to a further ground plane.

It is therefore an object of this invention to provide a printed circuit mountable ceramic filter module having minimized leakage across its terminals.

It is a further object of this invention to provide a printed circuit mountable ceramic filter having a substantially infinite ground plane equivalent between its terminals.

It is a further object of this invention to provide a printed circuit mountable ceramic filter module which closely approximates the insertion loss characteristics of the filter module when mounted in a coaxial environment.

The above objects and still further objects of the invention will immediately become apparent to those skilled in the art after consideration of the following preferred embodiment thereof, which is provided by way of example and not by way of limitation, wherein:

FIG. 2 is a view of the assembly of FIG. 1 prior to encapsulation;

FIG. 3 is a view taken along the line 3—3 of FIG. 2;

Figure 1:
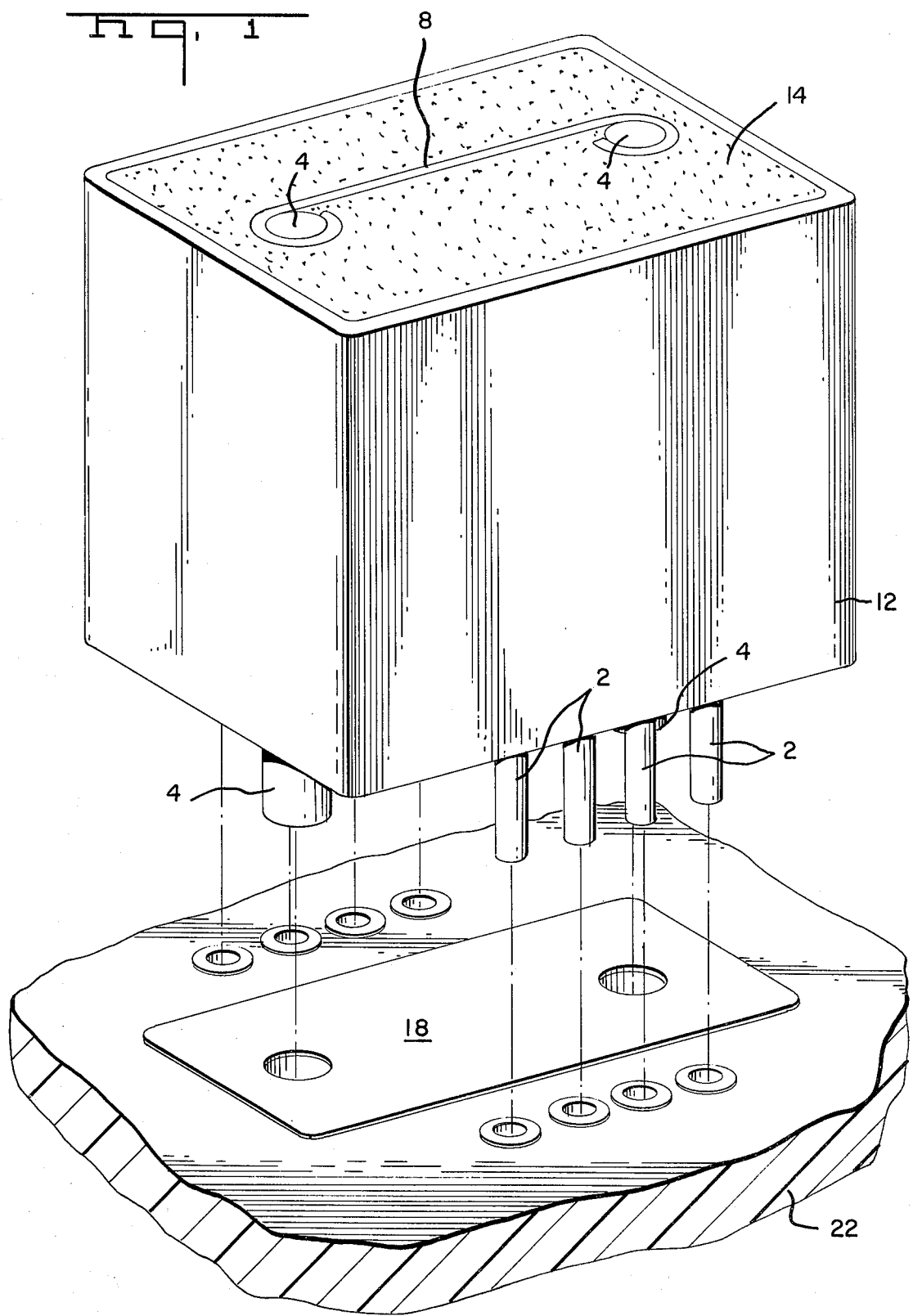
FIG. 1 is a three dimensional view of a filter assembly in accordance with the present invention.

Referring now to FIG. 1, there is shown a filter assembly in accordance with the present invention. The assembly includes a housing 12 preferably of rigid plastic, within which the filters are mounted. An epoxy or other appropriate potting material 14 is placed in the housing 12 and encapsulates the filters and other components as will be described hereinbelow. Filter pins 2 and grounding pins 4 extend from the housing 12.

The filters 10 are mounted on a header 16 which, if desired, can be integral with housing 12 as shown in FIGS. 2 and 3. The header includes apertures which accept the leads 2 and 4. A ground plane 18 is formed on the upper surface of a printed circuit board 22 and a second ground plane 20 is formed on the lower surface of board 22. Either of the ground planes 18 and 20 could be eliminated. A ground plane 6 is secured to the grounding area of the filter sleeves of the filters 10 as by solder 11 and a ground plane 8 is secured to said sleeves as by solder and/or said ground plane 6 and positioned normal to the plane 6. As stated above, plane 8 can extend to the upper surface of the material 14 as shown in FIG. 1. The ground leads 4, which are connected to the ground planes 6 and 8, are also connected to the ground planes 18 and/or 20 when the assembly of FIG. 1 is mounted on the printed circuit board.

Figure 4:
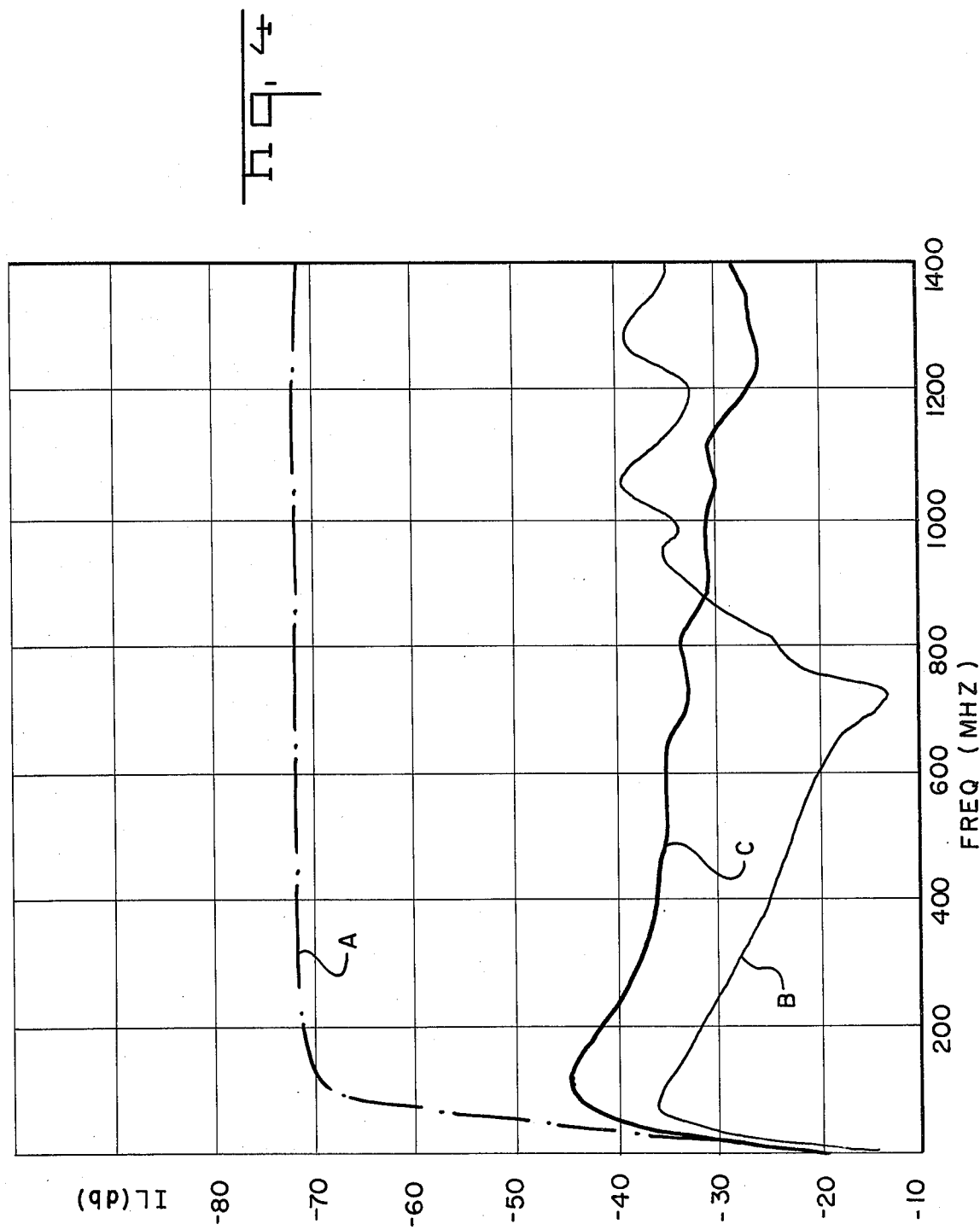
FIG. 4 is a graph showing insertion loss as a function of frequency for a filter in three different environments.

Referring now to FIG. 4, there is shown curves of insertion loss in db as a function of frequency in various filter assemblies. The curve A shows the characteristics of a ceramic filter, such as shown in U.S. Pat. No. 3,743,978 to William Baird Fritz, when mounted in ideal fashion for maximum performance, this being a substantially coaxial environment. The curve B shows the same filter as curve A when mounted on a printed circuit board and having a ground plane 8 but no ground plane 6 as shown in FIG. 2. The curve C shows the same filter as in curve B but with ground plane 6 included. It can be seen that the insertion loss in curve C shows about a 10 db improvement over curve B and is also relatively flat across the entire measured range.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A filter assembly, comprising:
    a header having a first ground plane thereon,
    a plurality of ceramic filter elements positioned in side-by-side relation overlying said first ground plane,
    electrical leads on said filters projecting outwardly through said header,
    a second ground plane normal to said first ground plane and electrically engaged upon and overlying said filters,
    a printed circuit board having a ground plane thereon, and
    electrically conducting pins connected to said frist and said second ground planes and projecting through said header for pluggable connection to the ground plane of said printed circuit board.

2. A filter assembly, comprising:

a header, a first ground plane on said header, a plurality of ceramic filters positioned on said header and having grounding sleeves overlying said first ground plane, a second ground plane normal to said first ground plane and overlying said grounding sleeves, said first and said second ground planes being electrically connected to opposed sides of said grounding sleeves, a housing containing said first and said second ground planes and said filters, potting material filling said housing, said potting material extending to but not covering the upper edge portion of said second ground plane, a printed circuit board having a ground plane thereon, said filters having electrical leads projecting outwardly through said header and said housing for electrical connection to said printed circuit board, and electrical connector means within said housing connecting said first and said second ground planes and projecting outwardly through said header and said housing for electrical connection to said ground plane of said printed circuit board.

3. A filter assembly, comprising:

a header, a first ground plane member mounted on said header, a plurality of ceramic filters overlying said first ground plane member and being electrically connected thereto, a second ground plane member projecting normal to said first ground plane member and electrically engaging and overlying said ceramic filters, a printed circuit board having a ground plane means thereon, a plurality of pins connecting said first and said second ground plane members and said ground plane means and mounting said ground plane members to said printed circuit board, said pins being adapted for pluggable connection to said printed circuit board, and said second ground plane member encircling said pins which project normally through said frist ground plane member.

4. A filter assembly, comprising:

a header, a first ground plane member mounted on said header, a second ground plane member, a plurality of ceramic filters disposed between said first and said second ground plane members and being electrically grounded to said first and said second ground plane members, a printed circuit board having a ground plane means thereon, a plurality of pins connecting said first and said second ground plane members and said ground plane means and mounting said ground plane members to said printed circuit board, said pins being adapted for pluggable connection to said printed circuit board, a housing, said header being at one end of said housing, said filters being within said housing and having electrical leads protruding through said header, said mounting means being within said housing and protruding through said header, and potting material filling said housing, said leads and said mounting means protruding from said housing and being pluggably connected to said printed circuit board.

* * * * *